United States Patent [19]

Fukudome

[11] Patent Number: 5,341,086

[45] Date of Patent: Aug. 23, 1994

[54] CONSTANT-CURRENT CIRCUIT FOR LIGHT-EMITTING ELEMENT

[75] Inventor: Fujito Fukudome, Kawasaki, Japan

[73] Assignee: Fujitsu Limited, Japan

[21] Appl. No.: 778,008

[22] Filed: Oct. 17, 1991

[30] Foreign Application Priority Data

Oct. 20, 1990 [JP] Japan .................. 2-283207

[51] Int. Cl.⁵ .............................. G05F 1/56
[52] U.S. Cl. ..................... 323/273; 323/902; 359/174
[58] Field of Search ............ 323/265, 273, 274, 277, 323/311, 312, 902; 340/425, 826, 827; 359/174; G05F 1/56

[56] References Cited

U.S. PATENT DOCUMENTS 4,011,557  3/1977  Chetelat et al. .
4,017,847  4/1977  Burford et al. .

FOREIGN PATENT DOCUMENTS 0293921  12/1988  European Pat. Off. .
2147944   3/1973  Fed. Rep. of Germany .
  47347   of 1983  Japan .
 171140   of 1983  Japan .

Primary Examiner—Emanuel T. Voeltz
Attorney, Agent, or Firm—Welsh & Katz, Ltd.

[57] ABSTRACT

A constant-current circuit includes a circuit current source for generating a circuit current necessary for the constant-current circuit, and a light-emitting element current source for passing a first current which is part of the circuit current through a light-emitting element in response to an input signal. A current control circuit detects a change in the first current and generates a control signal based on the change in the first current. A controlled current source passes a second current which is part of the circuit current and changes the amount of the second current on the basis of the control signal so that the circuit current has a fixed amount.

19 Claims, 7 Drawing Sheets

CONSTANT-CURRENT CIRCUIT FOR LIGHT-EMITTING ELEMENT

BACKGROUND OF THE INVENTION (1) Field of the Invention

The present invention generally relates to constant-current circuits, and more particularly to a constant-current circuit for a light-emitting element for use in, for example, a communication system.

(2) Description of the Prior Art

An optical communication device, such as an optical repeater, has a light-emitting element and a constant-current circuit for supplying a constant current to the light-emitting element.

FIG. 1 is a block diagram of a conventional constant-current circuit for a light-emitting element, such as a laser diode (see Japanese Laid-Open Patent Application No. 58-171140). The constant-current circuit shown in FIG. 1, connected to a laser diode LD, is composed of an input signal break detection/control circuit 11, a laser diode driving circuit 12, a Zener diode 13, an npn transistor Q, and resistors R1 and R2. The control circuit 11, which includes a peak-to-peak detection circuit, converts a pulse-shaped input signal (which corresponds to an optical input signal applied to the optical repeater) from a terminal 10 into a D.C. current signal, and generates a bias signal from the D.C. current signal. The bias signal is applied to the laser diode driving circuit 12. While the control circuit 11 is not receiving the input signal, the control circuit 11 generates a base current, which is applied to the base of the transistor Q via the resistor R1.

The laser diode LD is turned ON and OFF by the laser diode driving circuit 12 in response to the input signal. An optical output signal is emitted from the laser diode LD when the optical input signal is input to the optical repeater. During this state, the transistor Q is maintained in the OFF state since the control circuit 11 does not generate the base current of the transistor Q. When the optical input signal is not received by the optical repeater, the laser diode driving circuit 12 does not receive the input signal and the bias signal, and thus the laser diode LD does not emit any optical output signal. During this time, the control circuit 11 supplies the base current to the base of the transistor Q via the resistor R1. Hence, the transistor Q is turned ON, and a current from a line L1 passes to a line L2 through a current bypass circuit composed of the transistor Q and the resistor R2.

When the optical input signal is not applied to the optical repeater, a decreased amount of current is consumed in the laser diode driving circuit 12, as compared with the amount of current obtained when the optical repeater receives the optical input signal. For this reason, the control circuit 11 generates the base current so that an increased amount of current passes through the bypass circuit composed of the transistor Q and the resistor R2 in order to compensate for the decrease in the current consumed in the laser diode driving circuit 12. In this manner, it becomes possible to pass a fixed amount of current through the Zener diode 13. The above operation can be described as follows:

$$I_{LD} = I_{LD}' + I \quad (1)$$

where $I_{LD}$ is the current consumed in the laser diode driving circuit 12 when the optical input signal is received, $I_{LD}'$ is the current consumed in the laser diode driving circuit 12 when the optical input signal is not received, and I is the current passing through the transistor Q. When the equation (1) is satisfied, the current passing from the line L1 to the line L2 does not change irrespective of whether or not the optical input signal is received.

However, it is impossible for the conventional constant-current circuit to compensate for a change in the bias current arising from a change in ambient temperature and/or deterioration of the laser diode.

SUMMARY OF THE INVENTION

It is a general object of the present invention to provide a constant-current circuit in which the above disadvantage is eliminated.

A more specific object of the present invention is to provide a constant-current circuit capable of compensating for a change in the bias current arising from a change in ambient temperature and/or deterioration of the laser diode.

The above objects of the present invention are achieved by a constant-current circuit for a light-emitting element, the constant-current circuit comprising: circuit current source means for generating a circuit current necessary for the constant-current circuit; first means, coupled to the light-emitting element, for passing a first current which is part of the circuit current through the light-emitting element in response to an input signal; current control means, coupled to the first means, for detecting a change in the first current and for generating a control signal based on the change in the first current; and second means, coupled to the current control means, for passing a second current which is part of the circuit current and for changing the amount of the second current on the basis of the control signal so that the circuit current has a fixed amount.

BRIEF DESCRIPTION OF THE DRAWINGS

Other objects, features and advantages of the present invention will become apparent from the following detailed description when read in conjunction with the accompanying drawings, in which.

DESCRIPTION OF THE PREFERRED EMBODIMENTS

Figure 1:
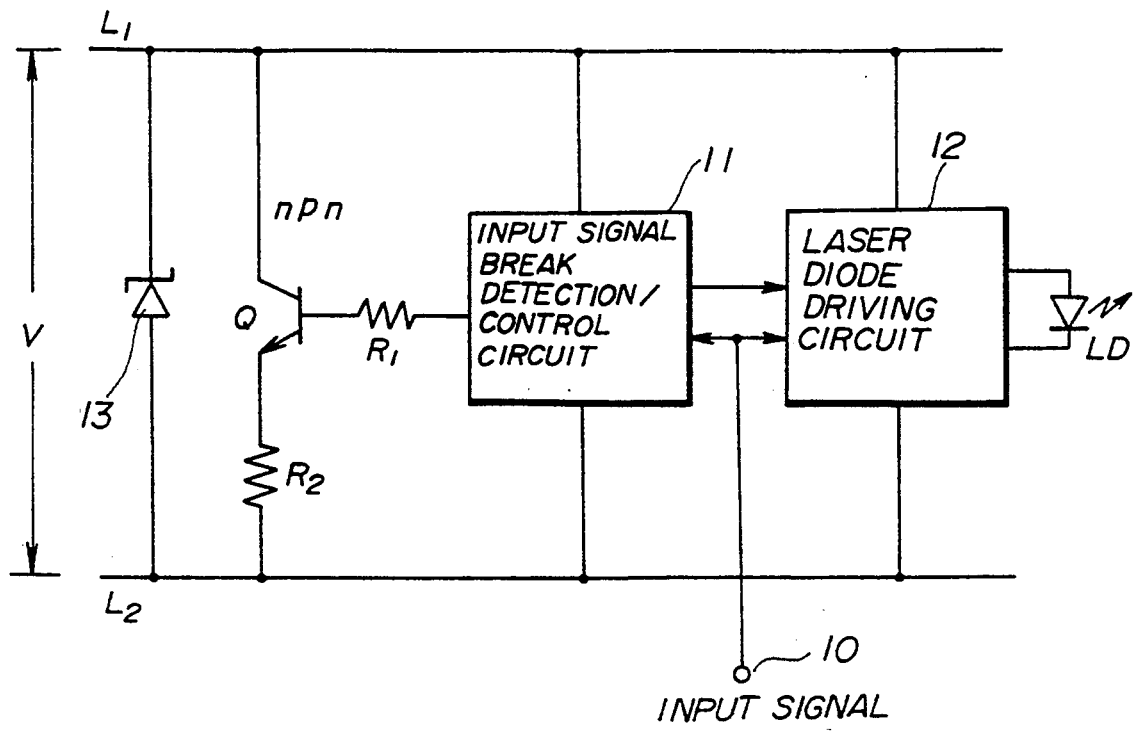
FIG. 1 is a block diagram of a conventional constant-current circuit for a laser diode.
Figure 2:
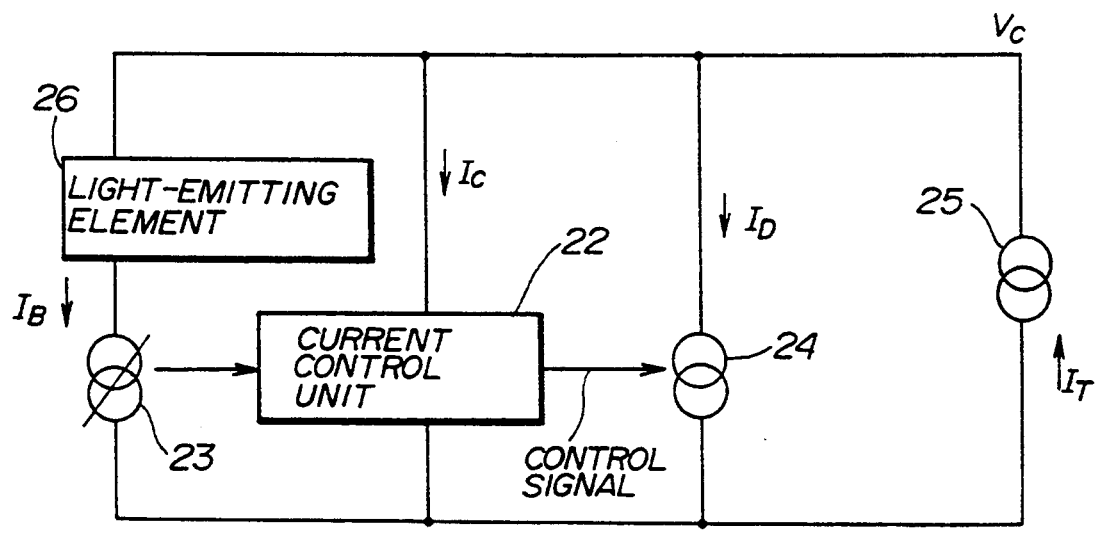
FIG. 2 is a block diagram of an outline of the constant-current circuit according to the present invention.

Referring to FIG. 2, the constant-current circuit is composed of a current control unit 22, a light-emitting element current source 23, a controlled current source 24, and a circuit current source 25. A light-emitting element 26, such as a laser diode, is connected between a power supply line ($V_C$ line) set to a power supply voltage $V_C$ and the light-emitting element current source 23.

A current $I_B$ passes through the light-emitting element current source 23, a current $I_C$ passes through the current control unit 22, and a current $I_D$ passes through the controlled current source 24. The current $I_C$ is almost constant. A circuit current $I_T$ is generated by the circuit current source 25. The current control unit 22 always detects the amount of current $I_B$. The current control unit 22 is programmed so that it detects a largest amount of current $I_B$ and a smallest amount of current $I_B$. The current control unit 22 detects the difference between the amount of current $I_B$ actually passing through the current source 23 and the largest amount of current $I_B$, and outputs a control signal to the controlled current source 24 so that the control signal causes the current $I_T$ generated by the circuit current source 25 to be always constant even if the amount of current $I_B$ passing through the light-emitting element 26 changes.

Figure 3:
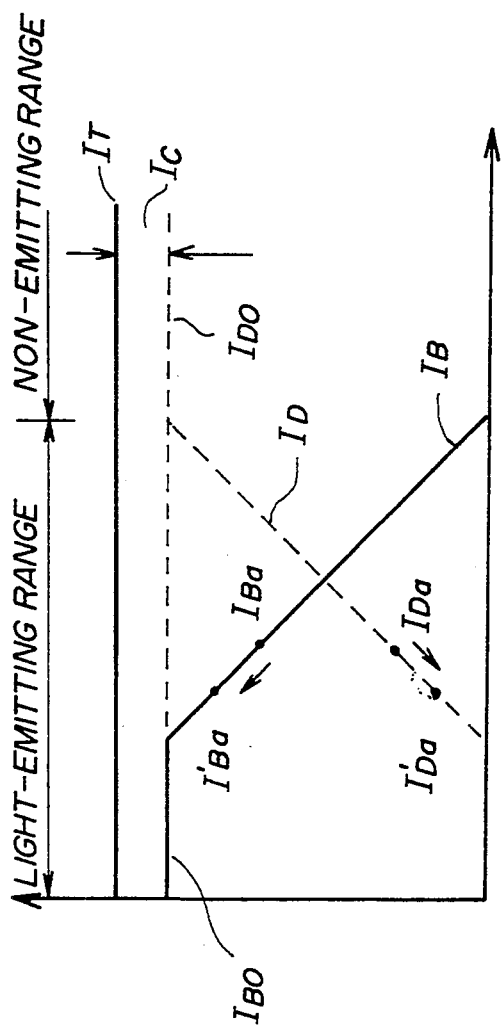
FIG. 3 is a waveform diagram showing the operation of the constant-current circuit shown in FIG. 2.

FIG. 3 shows the characteristics of the light-emitting element current source 23 and the controlled current source 24. As shown, the largest amount of current $I_B$ (labeled $I_{B0}$) generated by the current source 23 is almost the same as the largest amount of current $I_D$ (labeled $I_{D0}$) generated by the current source 24, and the smallest amount of current $I_B$ is almost the same as the smallest amount of the current $I_D$. When the largest current $I_{B0}$ is generated by the current source 23, the amount of current $I_D$ generated by the current source 24 is zero. When the largest current $I_{D0}$ is generated by the current source 24, the amount of current $I_B$ is zero. The current $I_B$ substantially linearly changes between the largest and smallest amounts thereof, and the current $I_D$ substantially linearly changes between the largest and smallest amounts thereof.

When the current control unit 22 detects the largest current $I_{B0}$ ($I_B = I_{B0}$) generated by the current source 23, the current control unit 22 outputs the control signal to the current source 24 so that the current $I_D$ becomes zero. In this case, the current $I_T$ generated by the current source 25 (consumed in the entire circuit) is equal to ($I_{B0} + I_C$). As has been described, the current $I_C$ is substantially fixed.

When $I_B = I_{Ba}$, the current control unit 22 detects the current $I_{Ba}$ and outputs the control signal to the current source 24 so that it generates a current $I_{Da}$ (= $I_{B0}$ ($I_{C0}$) − $I_{Ba}$). That is, the total of the amount of current $I_B$ and the amount of current $I_C$ is always equal to the largest amount of current $I_B$ (or $I_C$). When $I_B = 0$, the current control unit 22 detects the $I_B$ equal to zero and outputs the control signal to the current source 24 so that it generates the largest current $I_{D0}$ (= $I_{B0}$).

In the above-mentioned manner, the current control unit 22 controls the current source 24 so that the sum of the amount of current $I_D$ and the amount of current $I_B$ is always equal to the largest amount of current $I_{B0}$. A light-emitting range of the laser diode 26 and a non-emitting range thereof are defined as shown in FIG. 3. The largest current $I_{B0}$ flows and the current $I_C$ does not flow at the boundary between the light-emitting range and the non-emitting range.

As will be described later, the characteristics of the current sources 23 and 24 shift in the horizontal directions due to the temperature variations and/or age deterioration. Such a change will be compensated for by an automatic power control (APC) procedure.

Figure 4:
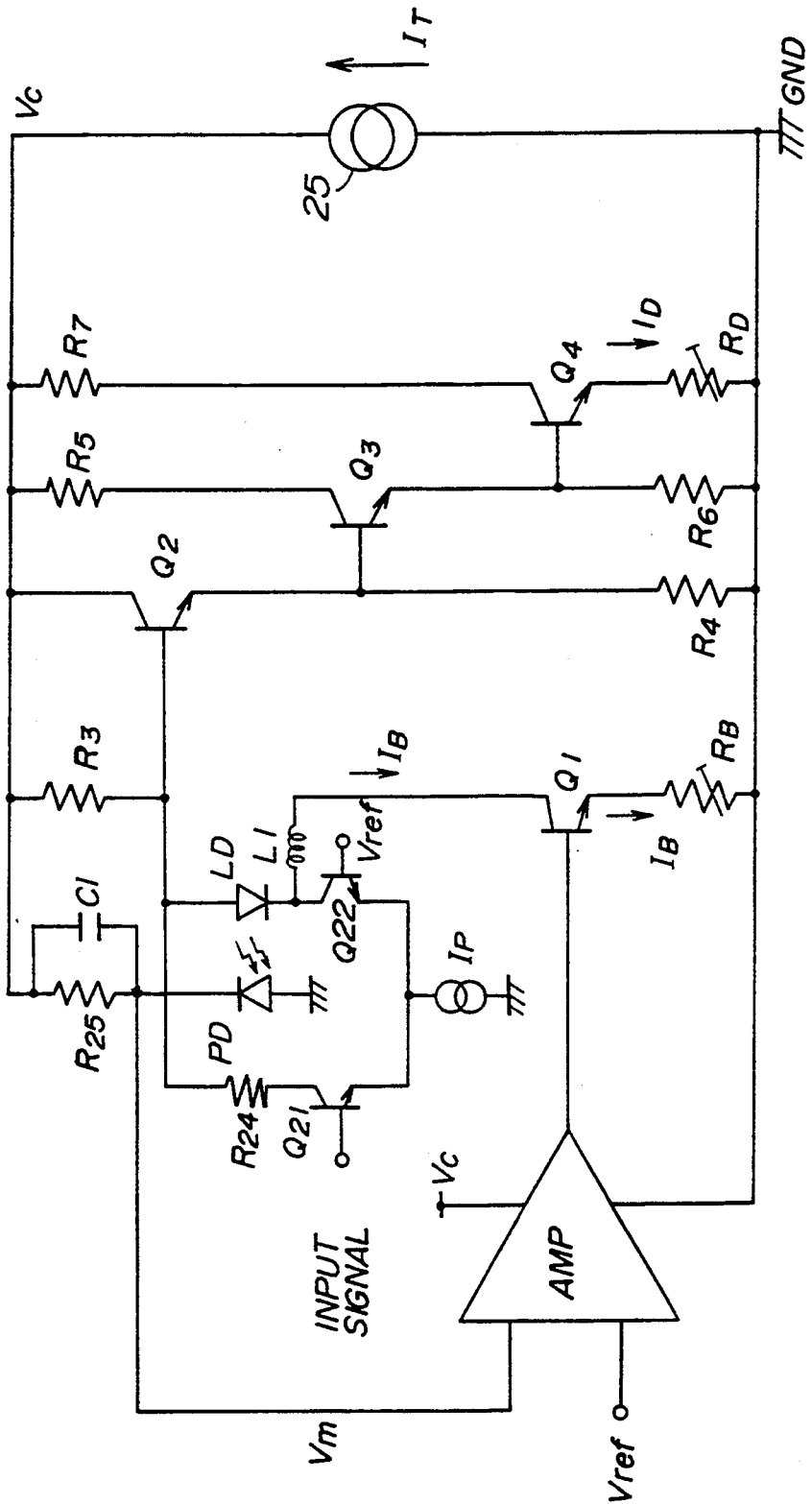
FIG. 4 is a circuit diagram of a first preferred embodiment of the present invention.

FIG. 4 is a circuit diagram of the constant-current circuit according to a first preferred embodiment of the present invention. An npn transistor Q1 and a variable resistor $R_B$ form the light-emitting element current source 23 shown in FIG. 2. Two npn transistors Q2 and Q3 and resistors R3–R6 form the current control unit 22 shown in FIG. 2. An npn transistor Q4, a resistor R7 and a variable resistor $R_D$ form the controlled current source 24 shown in FIG. 2. A laser diode LD corresponds to the light-emitting element 26 shown in FIG. 2. Although not shown in FIG. 2, a laser diode driving circuit and an APC circuit are provided in the circuit in FIG. 4. The laser diode driving circuit is composed of two npn transistors Q21 and Q22, a current source $I_P$ and a resistor R24. The APC circuit is composed of a photodiode PD, a resistor R25, a capacitor C1, an inductor L1, an operational amplifier AMP, and the above-mentioned transistor Q1 and variable resistor $R_B$. A reference signal Vref is applied to the operational amplifier AMP, and a reference signal Vref1 is applied to the base of the transistor Q22. An input signal corresponding to an optical input signal is applied to the base of the transistor Q21.

A series circuit composed of the resistor R3, the laser diode LD and the inductor L1 connected in series is connected between the $V_C$ line (first power supply line) and the collector of the transistor Q1. The base of the transistor Q2 is connected to a node where the anode of the laser diode LD is connected to the resistor R3. The variable resistor $R_B$ is connected between the emitter of the transistor Q1 and the ground line GND (second power supply line). The collector of the transistor Q2 is connected to the $V_C$ line and the emitter thereof is connected to the base of the transistor Q3 and grounded via the resistor R4. The resistor R5 is connected between the $V_C$ line and the collector of the transistor Q3, and the resistor R6 is connected between the emitter of the transistor Q3 and the ground. The base of the transistor Q4 is connected to the emitter of the transistor Q3. The resistor R7 is connected between the $V_C$ line and the collector of the transistor Q4, and the variable resistor $R_D$ is connected between the emitter of the transistor Q4 and the ground. The circuit current source 25 is connected between the $V_C$ line and the ground line.

The collector of the transistor Q22 is connected to the cathode of the laser diode LD, and the emitter thereof is connected to the current source $I_P$. The collector of the transistor Q21 is coupled to the base of the transistor Q2 via the resistor R24, and the emitter of the transistor Q21 is connected to the current source $I_P$. The cathode of the photodiode PD is coupled to the $V_C$ line via a parallel circuit composed of the resistor R25 and the capacitor C1, and the anode thereof is grounded. Further, the cathode of the photodiode PD is connected to the operational amplifier AMP.

A description will now be given of the operation of the circuit shown in FIG. 4. Since the operation of the APC circuit is not directly related to the operation of the circuit part corresponding to the configuration shown in FIG. 2, the operation of the circuit shown in FIG. 4 will be described separately from the operation of the APC circuit.

When the transistor Q1 is OFF, the emitter current of the transistor Q1, that is, the bias current $I_B$ of the laser diode $L_D$ is substantially zero. Thus, the voltage drop developed across the resistor R3 is approximately zero volt. From this point of view, the variable resistor $R_D$ is adjusted so that the following equation is satisfied:

$$V_C = V_{BE}(Q2) + V_{BE}(Q3) + V_{BE}(Q4) + I_D R_D$$

where $V_{BE}(Q)$ denotes the base-emitter voltage of transistor Q. For example, $V_{BE}(Q2)$ denotes the base-emitter voltage of the transistor Q2. In this state, the largest amount of current $I_D$ passes through the transistor Q4, as will be seen from FIG. 3.

The resistor R3 is adjusted so that the following equation is satisfied when the largest amount of current $I_B$ passes through the transistor Qi:

$$V_C = V_{BE}(Q2) + V_{BE}(Q3) + V_{BE}(Q4) + R_D I_D$$

In this state, the voltage drop is not developed across the resistor $R_D$, and the largest current $I_{B0}$ passes through the transistor Q1.

As the current $I_B$ starts to flow, a voltage drop is developed across the resistor R3. Since the base-emitter voltages of the transistors Q2, Q3 and Q4 are constant and the same as each other, the voltage developed across the resistor $R_D$ decreases so that the sum of the voltage drops is equal to $V_C$. That is, when the current $I_B$ increases, the current $I_D$ is compensated for so that the current $I_T$ generated by the circuit current source is always fixed. The above operation is indicated by the two arrows. It will be noted that since the current $I_P$ generated by the current source $I_P$ is fixed it can be handled in the same way as the current $I_C$.

Figure 5A:
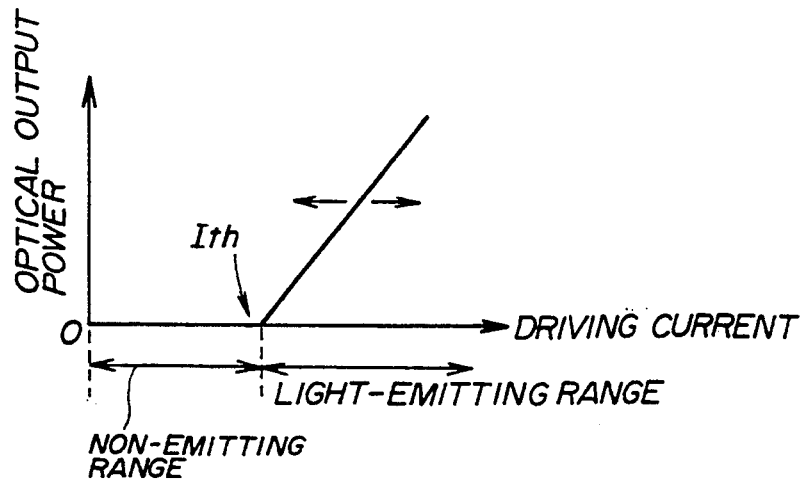
FIGS. 5A and 5B are graphs showing the operation of an automatic power control circuit used in the circuit shown in FIG. 4.
Figure 5B:
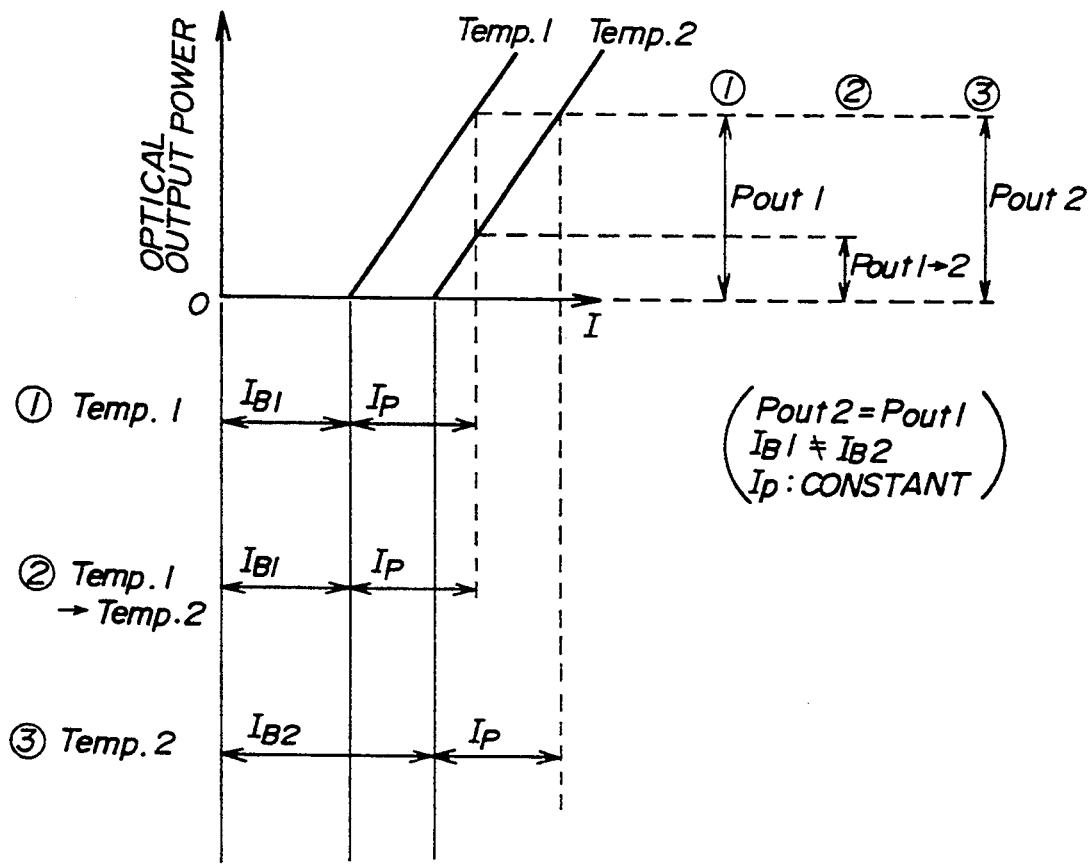

A description will now be given of the operation of the APC circuit with reference to FIGS. 5A and 5B. As shown in FIG. 5A, a threshold current Ith of the laser diode LD changes as the temperature thereof changes. The horizontal axis of the graph of FIG. 5A denotes the laser diode driving current (which corresponds to the aforementioned current $I_B$), and the vertical axis thereof denotes the optical output power of the laser diode. As shown in FIG. 5B, it is now assumed that the temperature of the laser diode LD changes from a temperature Temp.1 (at which the stable light-emitting operation operation is being carried out) to a temperature Temp.2. At the moment of this temperature change, the optical output power of the laser diode LD decreases from Pout1 to Pout1-2. This decrease in the optical output power is detected by the photodiode PD. Then, the cathode voltage Vm of the photodiode PD increases, and hence the operational amplifier AMP increases the base voltage of the transistor Q1 and thus increases the current $I_B$ from $I_{B1}$ to $I_{B2}$. As a result, the optical output power Pout1-2 is increased so that Pout2=Pout1.

Figure 6:
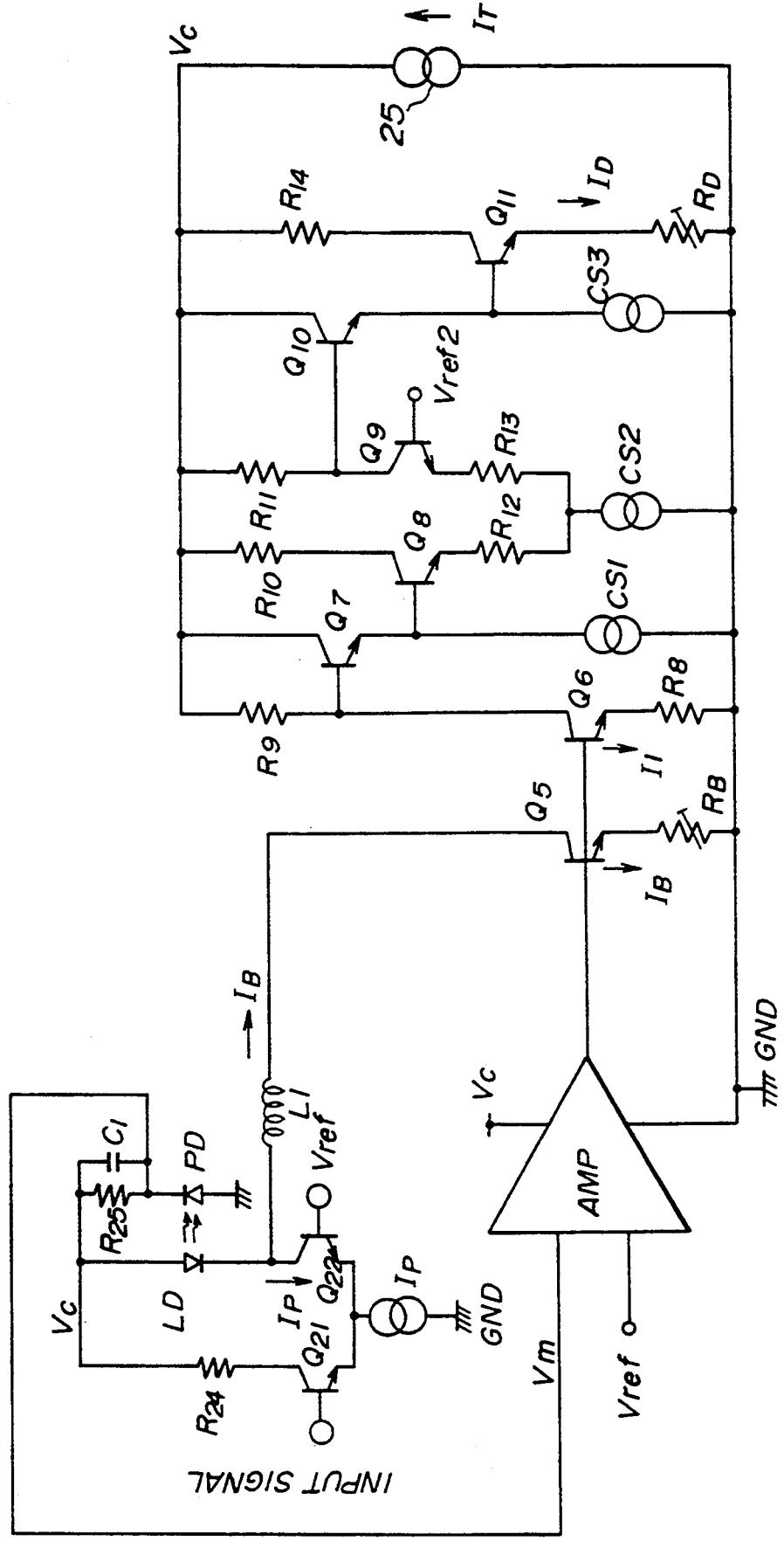
FIG. 6 is a circuit diagram of a second preferred embodiment of the present invention.

A description will now be given of a second preferred embodiment of the present invention with reference to FIG. 6, in which those parts which are the same as those shown in the previously described figures are given the same reference numerals. Two npn transistors Q5 and Q6, a resistor R8 and the variable resistor $R_B$ form the light-emitting element current source 23 shown in FIG. 2. Four npn transistors Q7–Q10, five resistors R9–R13, and three constant-current sources CS1–CS3 form the current control unit 22 shown in FIG. 2. An npn transistor Q11, a resistor R14 and the variable resistor $R_D$ form the controlled current source 24. The laser diode driving circuit and the APC circuit shown in FIG. 6 are the same as those shown in FIG. 4.

The bases of the transistors Q5 and Q6 are connected to each other, and hence $V_{BE}(Q5) = I_B \cdot R_B = R8 \cdot I1$ where I1 is the emitter current of the transistor Q6. Thus, the amount of current I1 is automatically defined by determining the magnitudes of current $I_B$ and resistors $R_B$ and R8. A voltage drop developed across the resistor R9 is equal to R9·I9. It will be noted that this voltage is proportional to the current $I_B$. The emitter voltage of the transistor Q7 is lower than the voltage drop developed across the resistor R9 by the base-emitter voltage thereof. The emitter voltage of the transistor Q7 is applied to the base of the transistor Q8. The constant-current source CS1 is connected to the emitter of the transistor Q7.

The transistors Q8 and Q9 form a differential amplifier. The collectors of the transistors Q8 and Q9 are connected to the $V_C$ line via the resistors R10 and R11, respectively. A reference signal Vref2 is applied to the base of the transistor Q9. By using the differential amplifier, the voltage developed across the resistor R10 has a large linear portion, and the voltage developed across the resistor R11 has a large linear portion. Thus, the constant-current circuit has an increased response characteristic. The following equation can be obtained:

$$V_C = \text{(voltage drop developed across the resistor } R11) + V_{BE}(Q10) + V_{BE}(Q11) + I_D R_D.$$

When the voltage drop developed across the resistor R11 changes, the current $I_D$ changes so as to compensate for the change in the voltage drop. That is, as the current $I_B$ increases, the current $I_D$ decreases so that the current $I_T$ is always fixed.

Figure 7:
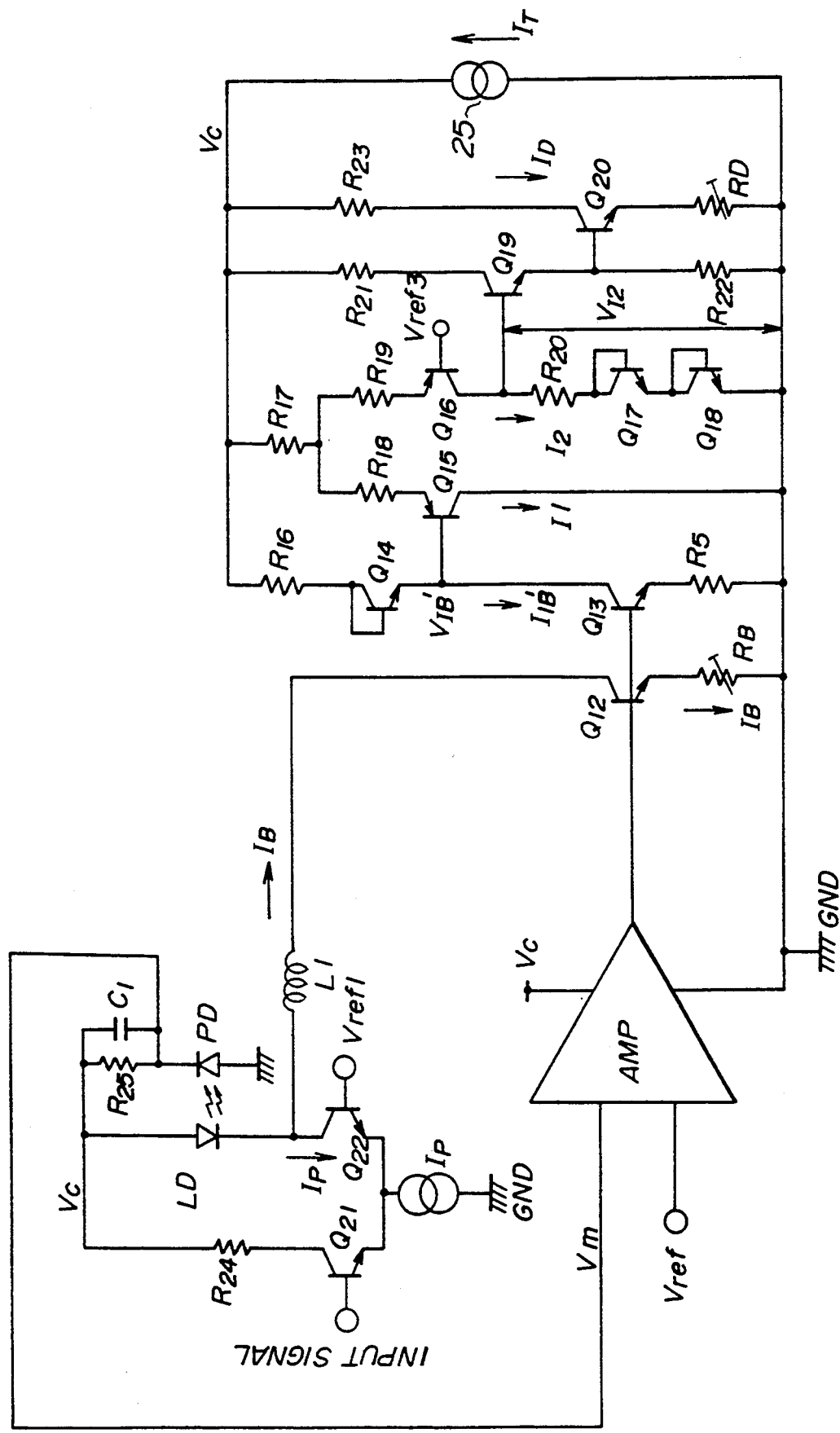
FIG. 7 is a circuit diagram of a third preferred embodiment of the present invention.

A description will now be given of a third preferred embodiment of the present invention with reference to FIG. 7. Two npn transistors Q12 and Q13, a resistor R15 and the variable resistor $R_B$ form the light-emitting element current source 23 shown in FIG. 2. Four npn transistors Q14 and Q17–Q19, two pnp transistors Q15 and Q16, and resistors R16–R22 form the current control unit 22 shown in FIG. 2. An npn transistor Q20, a resistor R23 and the variable resistor $R_D$ form the controlled current source 24 shown in FIG. 2. Each of the transistors Q17 and Q18 connected in series is diode-connected. The circuit shown in FIG. 7 has the same laser diode driving circuit and APC circuit as has been described previously.

When the current $I_B$ increases, a current $I_B'$ passing through the transistor Q13 increases by $I_B \cdot R_B / R15$. At this time, the voltage difference between the power supply voltage $V_C$ and the base voltage $V_{IB}$ of the transistor Q15 is described as follows:

$$R16 \cdot I_B' + V_{BE}(Q14) = I_B(R_B \cdot R16)/R15 + V_{BE}(Q14)$$

Figure 8:
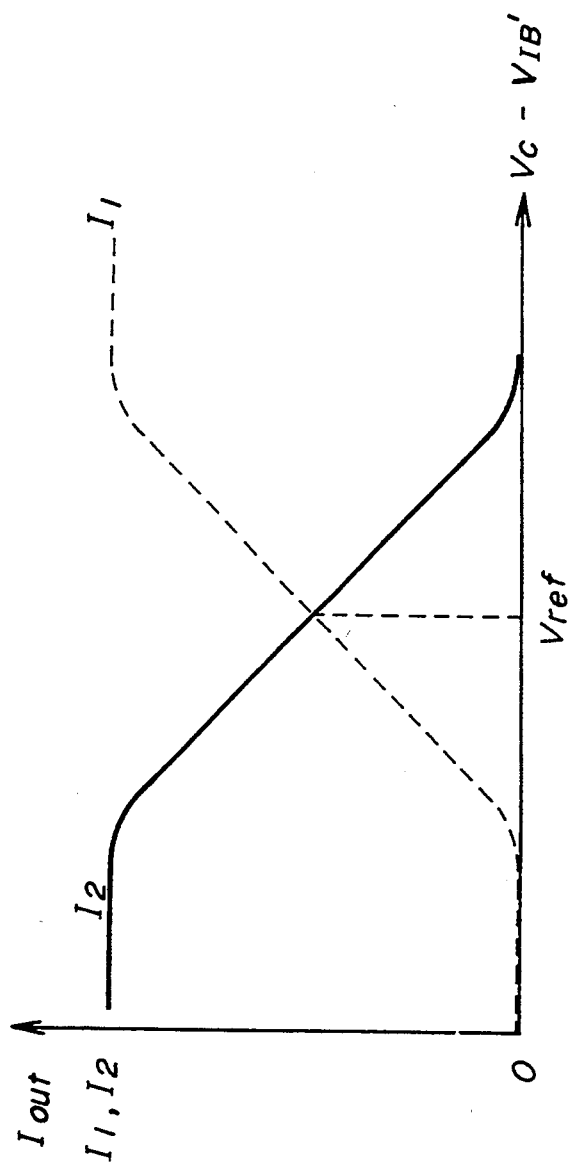
FIG. 8 is a waveform diagram showing the operation of the circuit shown in FIG. 7.

The resistors R17, R18, R19 and R20, and the transistors Q15–Q18 form a differential amplifier, which has a static characteristic as shown in FIG. 8. A reference signal Vref3 is applied to the base of the transistor Q16. As shown, the voltage difference between $V_C$ and $V_{IB}'$ ($V_C - V_{IB}'$) increases as the current $I_B$ increases and thus the current $I_B'$ increases. As the voltage difference between $V_C$ and $V_{IB}$ increases, a collector current I2 of the transistor Q16 decreases, and a collector current I1 of the transistor Q15 increases. Thus, the collector current I2 decreases as the current $I_B$ increases.

The collector current I2 and the current $I_D$ have the following relationship:

$$V_{l2} = l2 \cdot R20 + V_{BE}(Q17) + V_{BE}(Q18)$$
$$= V_{BE}(Q19) + V_{BE}(Q20) + I_D \cdot R_D$$

where $V_{l2}$ is the base voltage of the transistor Q19 (or a voltage drop developed across a series circuit composed of the resistor R20 and the transistors Q17 and Q18). In general, the base-emitter voltages of transistors are constant and almost the same as each other. Thus, $V_{BE}(Q17) = V_{BE}(Q18) = V_{BE}(Q19) = V_{BE}(Q20)$. In this case, $I2 \cdot R20 = I_D \cdot R_D$, and hence the current I2 is substantially proportional to the current $I_D$. As a result, the current $I_B$ is inversely proportional to the current $I_D$. This means that the circuit shown in FIG. 8 operates in the same way as has been described with reference to FIG. 2.

It is possible to provide two constant-current circuits of the present invention, one of which is a master circuit and the other of which is a slave circuit. Normally, the light-emitting element of the slave circuit is controlled so that it does not emit light. However, the duplex circuit is controlled so that the entire current thereof is always constant.

The present invention is not limited to the specifically disclosed embodiments, and variations and modifications may be made without departing from the scope of the present invention.

What is claimed is:

1. A constant-current circuit for a light-emitting element, said constant-current comprising:
   circuit current source means for generating a constant current necessary for the constant-current circuit;
   first means, coupled to said light-emitting element, for passing a first current, which is part of the circuit constant current, through said light-emitting element in response to an input signal;
   current control means, coupled to said first means, for detecting a change in the first current and for generating a control signal based on the change in the first current; and
   second means, coupled to said current control means, for passing a second current which is part of the constant current and for changing the amount of the second current on the basis of the control signal so that the constant current remains substantially fixed.

2. A constant-current source as claimed in claim 1, wherein said second means comprises means for changing the amount of the second current so that the change in the first current is canceled.

3. A constant-current source as claimed in claim 1, wherein said second means comprises means for changing the second current by an amount which corresponds to the change in the first current.

4. A constant-current circuit as claimed in claim 1, wherein said second means comprises means for changing the amount of the second current so that the sum of the amount of the first current and the amount of the second current is equal to a predetermined largest amount of the first current.

5. A constant-current circuit for a light-emitting element, said constant-current circuit comprising:
   circuit current source means for generating a constant current necessary for the constant-current circuit;
   first means, coupled to said light-emitting element, for passing a first current which is part of the constant current through said light-emitting element in response to an input signal;
   current control means, coupled to said first means, for detecting a change in the first current and for generating a control signal based on the change in the first current, said current control means including
      a first transistor having a first terminal receiving a first power supply line, a second terminal coupled to a second power supply line via a first resistor, and a base coupled to said first power supply line via a second resistor and said light-emitting element; and
      a second transistor having a first terminal coupled to said first power supply line via a third resistor, a second terminal coupled to the second power supply line via a fourth resistor, and a base coupled to the second terminal of said first transistor, said second means being coupled to the second terminal of said second transistor; and
   second means, coupled to said current control means, for passing a second current which is part of the constant current and for changing the amount of the second current on the basis of the control signal so that the constant current remains substantially fixed.

6. A constant-current circuit as claimed in claim 5, wherein:
   said second means comprises a third transistor having a first terminal coupled to the first power supply line via a fifth resistor, a second terminal coupled to the second power supply line via a sixth resistor, and a base coupled to the second terminal of said second transistor; and
   said circuit current source means is connected between said first power supply line and said second power supply line.

7. A constant-current circuit as claimed in claim 6, wherein each of said first, second and third transistors is an npn transistor.

8. A constant-current circuit as claimed in claim 6, wherein:
   said sixth resistor is a variable resistor; and
   said variable resistor has a resistance so that the sum of base-emitter voltages of said first, second and third transistors and a voltage drop developed across said variable resistor is equal to a voltage difference between said first and second power supply lines when said first transistor is OFF.

9. A constant-current circuit as claimed in claim 1, wherein said first means comprises a transistor having a first terminal coupled to the light-emitting element, a second terminal receiving a predetermined voltage, and a base receiving a predetermined bias voltage corresponding to said first current.

10. A constant-current circuit for a light-emitting element, said constant-current circuit comprising:
    circuit current source means for generating a constant current necessary for the constant-current circuit;
    first means, coupled to said light-emitting element, for passing a first current which is part of the constant current through said light-emitting element in response to an input signal;
    current control means, coupled to said first means, for detecting a change in the first current and for generating a control signal based on the change in the first current, said current control means including a first transistor having a first terminal coupled to a first power supply line, a second terminal coupled to a first current source coupled to a second power supply line, and a base receiving a predetermined signal corresponding to said first current, the base being coupled to said first power supply line via a first resistor;

a differential amplifier having a first input terminal coupled to the second terminal of said first transistor, a second terminal receiving a predetermined reference signal, and an output terminal; and a second transistor having a base coupled to the output terminal of said differential amplifier, a first terminal coupled to the first power supply line, and a second terminal coupled to a second current source, said second means being coupled to the second terminal of said second transistor; and second means, coupled to said current control means, for passing a second current which is part of the constant current and for changing the amount of the second current on the basis of the control signal so that the constant current remains substantially fixed.

11. A constant-current circuit as claimed in claim 6, wherein said differential amplifier comprises:

a third transistor having a base coupled to the second terminal of said first transistor, a first terminal coupled to said first power supply line via a second resistor, and a second terminal coupled to a third current source via a third resistor; and a fourth transistor having a base receiving said predetermined reference signal, a first terminal coupled to said first power supply line via a fourth resistor, and a second terminal coupled to said third current source via a fifth resistor, the first terminal of said fourth transistor being coupled to the base of said second transistor.

12. A constant-current circuit as claimed in claim 11, wherein said second means comprises a fifth transistor having a base coupled to the second terminal of said second transistor, a first terminal coupled to said first power supply line via a sixth resistor, and a second terminal coupled to said second power supply line via a seventh resistor.

13. A constant-current circuit as claimed in claim 10, wherein said first means comprises:

a third transistor having a base receiving a predetermined bias voltage corresponding to said first current, a first terminal coupled to the light-emitting element, and a second terminal coupled to the second power supply line via a second resistor; and a fourth transistor having a base coupled to the base of said fifth transistor, a first terminal coupled to the base of said first transistor, and a second terminal coupled to the second power supply line via a third resistor.

14. A constant-current circuit as claimed in claim 10, wherein said differential amplifier comprises:

a third resistor having a base coupled to the second terminal of said first transistor, a first terminal coupled to the first power supply line via second and third resistors connected in series, and a second terminal coupled to the second power supply line;

a fourth transistor having a base receiving a predetermined reference voltage, a first terminal coupled to the first power supply line via a fourth resistor and said third resistor connected in series, and a second terminal connected to the base of said second transistor; and a series circuit connected between the second terminal of said fourth transistor and the second power supply line.

15. A constant-current circuit as claimed in claim 14, wherein said series circuit comprises a fifth resistor and a diode connected in series.

16. A constant-current circuit as claimed in claim 14, wherein said current control means comprises:

a fifth resistor connected between the first power supply line and the first terminal of said second transistor; and a sixth resistor connected between the second terminal of said second transistor and the second power supply line.

17. A constant-current circuit as claimed in claim 11, wherein each of said third and fourth transistors is an npn transistor.

18. A constant-current circuit as claimed in claim 14, wherein each of said third and fourth transistors is a pnp transistor.

19. A constant-current circuit as claimed in claim 1, further comprising automatic power control means, coupled to the light-emitting element, for controlling the first current on the basis of an intensity of light emitted from the light-emitting element.

* * * * *

UNITED STATES PATENT AND TRADEMARK OFFICE
CERTIFICATE OF CORRECTION

PATENT NO. : 5,341,086  
DATED : August 23, 1994  
INVENTOR(S) : Fukudome

It is certified that error appears in the above-indentified patent and that said Letters Patent is hereby corrected as shown below:

Column 5, line 11, delete "$Q_i$" and insert --$Q1$--.

Column 9, line 26, delete "6" and insert --10--.

Signed and Sealed this

Fourth Day of April, 1995

Attest:

BRUCE LEHMAN

*Attesting Officer*     *Commissioner of Patents and Trademarks*